United States Patent
Takenaka

(10) Patent No.: US 6,927,138 B2
(45) Date of Patent: Aug. 9, 2005

(54) METHOD OF SEMICONDUCTOR DEVICE FABRICATION

(75) Inventor: Masahiro Takenaka, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/694,807

(22) Filed: Oct. 29, 2003

(65) Prior Publication Data

US 2004/0087107 A1 May 6, 2004

(30) Foreign Application Priority Data

Oct. 31, 2002 (JP) .................................... 2002-318894

(51) Int. Cl.⁷ ............................................ H01L 21/336
(52) U.S. Cl. .................... 438/294; 438/296; 438/424; 438/430; 438/431; 438/444; 438/700
(58) Field of Search ................................ 438/424, 425, 438/426, 427, 430, 431, 439, 444, 446, 448, 700, 295, 296, 297, 294

(56) References Cited

U.S. PATENT DOCUMENTS

| | | | | |
|---|---|---|---|---|
| 5,130,268 A | * | 7/1992 | Liou et al. | 438/425 |
| 5,155,571 A | * | 10/1992 | Wang et al. | 257/19 |
| 5,241,214 A | * | 8/1993 | Herbots et al. | 257/649 |
| 5,534,713 A | * | 7/1996 | Ismail et al. | 257/24 |
| 5,786,263 A | * | 7/1998 | Perera | 438/431 |
| 5,847,419 A | * | 12/1998 | Imai et al. | 257/192 |
| 5,915,191 A | * | 6/1999 | Jun | 438/431 |
| 5,963,817 A | * | 10/1999 | Chu et al. | 438/410 |
| 6,583,000 B1 | * | 6/2003 | Hsu et al. | 438/222 |
| 6,593,641 B1 | * | 7/2003 | Fitzergald | 257/616 |
| 6,600,170 B1 | * | 7/2003 | Xiang | 257/18 |

FOREIGN PATENT DOCUMENTS

JP 2002-76334 3/2002

* cited by examiner

*Primary Examiner*—Maria F. Guerrero
(74) *Attorney, Agent, or Firm*—Nixon & Vanderhye P.C.

(57) ABSTRACT

Provided is a method of semiconductor device fabrication capable of rounding the sharp edge portions of trenches so as to form device isolation regions having high electrical reliability. A semiconductor substrate comprising a lattice-strain relaxed silicon germanium layer, a silicon germanium layer, and a lattice strained silicon layer formed in this order of mention onto a silicon substrate is used, while trenches are formed in the portions for device isolation regions of the semiconductor substrate by etching. Then, a silicon film is deposited on the entirety of the exposed surface, and the deposited silicon film is dry-oxidized so as to form a silicon dioxide film. As a result, the edge portions of the trenches are rounded.

19 Claims, 5 Drawing Sheets

METHOD OF SEMICONDUCTOR DEVICE FABRICATION

BACKGROUND OF THE INVENTION

The present invention relates to a method of semiconductor device fabrication using a semiconductor substrate comprising a lattice-strain relaxed silicon germanium layer formed on a silicon substrate or an SOI (silicon-on-insulator) substrate, wherein a lattice strained silicon layer is formed on said silicon germanium layer, or alternatively wherein a lattice strained silicon layer is formed on one or more semiconductor layers formed on said silicon germanium layer.

DESCRIPTION OF THE RELATED ART

In the prior art, a semiconductor substrate is known that is fabricated for improving the mobility of carriers (electrons or holes) passing through a channel. That is, a silicon germanium layer 22 having lattice strain is formed into a virtual lattice shape on a silicon substrate 21, while the strain in the silicon germanium layer 22 due to lattice constant incommensurate to the silicon substrate 21 is relaxed by introducing misfit dislocations. Then, a silicon layer 24 serving as a cap layer is formed on this strain relaxed silicon germanium layer 22 where the lattice strain is relaxed (FIG. 4A). This silicon layer 24 suffers tension from the strain relaxed silicon germanium layer 22 having a larger lattice constant, and thereby has strain. This causes a change in the band structure, so as to improve the mobility of the carriers.

When a pair of CMOS transistors is fabricated using the semiconductor substrate fabricated as described above, as shown in FIGS. 4A–4C, 5D, and 5E, the portions for device activity regions in the semiconductor substrate surface are protected with photoresist 26 (FIG. 4B), while trenches T2 serving as device isolation grooves are formed by etching in the portions for device isolation regions (FIG. 4C). Then, a silicon dioxide film 29 serving as an insulation film is embedded in the trenches T2 by TEOS-CVD (tetraethylorthosilicate chemical vapor deposition). After that, the photoresist 26 is removed, and then the silicon dioxide film 29 is flattened by CMP (chemo-mechanical polishing) (FIG. 5D).

After that, impurities for well formation and for threshold voltage adjustment are introduced into the N-channel MOS transistor region and the P-channel MOS transistor region by ion implantation. Then, similarly to conventional methods of CMOS transistor fabrication, a gate oxide film 30 is formed, and then a polycrystalline silicon film is deposited by CVD. After that, gate electrodes 31 are formed by dry etching (FIG. 5E). Then, source-drain regions are formed, so that a pair of CMOS transistors is obtained (see, for example, JP-A 2002-76334).

In this fabrication method, as a result of the etching of the portions for device isolation regions, each trench T2 is formed into a shape having sharp edge portions E2 in the bottom (FIG. 4C). After that, the silicon dioxide film 29 is embedded in the trench T2 in the state that the edge portions E2 remain sharp. Accordingly, the silicon dioxide film 29 is formed in a shape corresponding to the trench T2 having sharp edge portions E2 (FIG. 5D). Thus, strain is concentrated on the edge portions E2, so as to induce lattice defects in the fabrication processes. This causes the problem that leak current increases between the source region and the well region not shown so as to affect adversely the electrical characteristics.

In order to avoid this adverse influence, in the formation of the device isolation regions in the semiconductor substrate, after the etching of the portions for device isolation regions, thermal oxidation may be performed on the trench surface so as to round the sharp edge portions in the trench formed by the etching. On the other hand, in a semiconductor substrate in which a strain relaxed silicon germanium layer is formed on a silicon substrate and in which a strained silicon layer is formed on the strain relaxed silicon germanium layer, the etching of the portions for device isolation regions causes the strain relaxed silicon germanium layer and the strained silicon layer to be exposed as the side surfaces of the trench. These strain relaxed silicon germanium layer and strained silicon layer have different thermal oxidation rates from each other. This causes non-uniformity in the formed oxide film and hence induces defects, so as to cause the problem of an increase in the leak current.

SUMMARY OF THE INVENTION

The invention has been devised with considering these situations. An object of the invention is to provide a method of semiconductor device fabrication in which after the portions for device isolation regions are etched, a silicon film is deposited on the substrate, and then the deposited silicon film is oxidized so as to form a uniform oxide film and round the sharp edge portions of trenches, so that device isolation regions are formed that have high electrical reliability.

An aspect of the invention is a method of semiconductor device fabrication using a semiconductor substrate comprising a lattice-strain relaxed silicon germanium layer and a lattice strained silicon layer formed in this order of mention onto a silicon substrate or onto a substrate having a silicon layer on the surface thereof, said method comprising: an etching step of etching the portions for device isolation regions of said semiconductor substrate so as to form device isolation grooves; a deposition step of depositing a silicon film on said semiconductor substrate; and an oxidation step of oxidizing the deposited silicon film.

According to the invention, a semiconductor substrate is used that comprises a lattice-strain relaxed silicon germanium layer and a lattice strained silicon layer formed in this order of mention onto a silicon substrate or onto a substrate having a silicon layer on the surface thereof. Then, the portions for device isolation regions of said semiconductor substrate are etched so as to form device isolation grooves. After that, a silicon film is deposited on said semiconductor substrate. Then, the deposited silicon film is oxidized. By virtue of this method, an oxide film having a uniform thickness is formed on the surfaces of the silicon germanium layer and the silicon layer exposed as the side surfaces of trenches by the etching, while sharp edge portions in the trenches formed by the etching are rounded. As a result, device isolation regions are formed in which the occurrence of leak current is avoided and which have high electrical reliability.

Another aspect of the invention is a method of semiconductor device fabrication using a semiconductor substrate comprising a lattice-strain relaxed silicon germanium layer, one or more semiconductor layers, and a lattice strained silicon layer formed in this order of mention onto a silicon substrate or onto a substrate having a silicon layer on the surface thereof, said method comprising: an etching step of etching the portions for device isolation regions of said semiconductor substrate so as to form device isolation grooves; a deposition step of depositing a silicon film on said semiconductor substrate; and an oxidation step of oxidizing the deposited silicon film.

According to the invention, a semiconductor substrate is used that comprises a lattice-strain relaxed silicon germanium layer, one or more semiconductor layers, and a lattice strained silicon layer formed in this order of mention onto a silicon substrate or onto a substrate having a silicon layer on the surface thereof. Then, the portions for device isolation regions of said semiconductor substrate are etched so as to form device isolation grooves. After that, a silicon film is deposited on said semiconductor substrate. Then, the deposited silicon film is oxidized. By virtue of this method, an oxide film having a uniform thickness is formed on the surfaces of the silicon germanium layer, the semiconductor layers (on the silicon germanium layer), and the silicon layer exposed by the etching, while sharp edge portions in the trenches formed by the etching are rounded. As a result, device isolation regions are formed in which the occurrence of leak current is avoided and which have high electrical reliability.

Another aspect of the invention is a method of semiconductor device fabrication, wherein in said deposition step, a silicon film of 5 through 10 nm is deposited.

According to the invention, the silicon film deposited on the semiconductor substrate in which device isolation grooves are formed has a thickness of at least 5 nm. This allows the sharp edge portions in the trenches to be rounded at a radius satisfying minimum requirement. Further, the deposited silicon film has a thickness of at most 10 nm. This avoids the formation of an unnecessarily thick oxide film, and hence maintains the detailed structure of the semiconductor device.

Another aspect of the invention is a method of semiconductor device fabrication, wherein in said oxidation step, said deposited silicon film is oxidized completely.

According to the invention, the silicon film deposited on the semiconductor substrate in which device isolation grooves are formed is oxidized completely. By virtue of this, a uniform oxide film is formed on the surfaces of the silicon germanium layer and the silicon layer (or on the surfaces of the silicon germanium layer, the semiconductor layers (on the silicon germanium layer), and the silicon layer) exposed as the side surfaces of trenches. This avoids possible defects that could occur owing to the remained interface between an unoxidized silicon film and the side surface of the trench in case that the surface of the deposited silicon film were oxidized partly.

Another aspect of the invention is a method of semiconductor device fabrication, further comprising the step of depositing a protective film for protecting portions for device activity regions onto the surface of said semiconductor substrate before said etching step.

According to the invention, before said etching step, a protective film composed of silicon nitride or the like is deposited on the surface of the semiconductor substrate, so as to protect, from the etching, the portions for device activity regions of the semiconductor substrate covered by the protective film. Further, the protective film serves as a stopper in the step of polishing the device isolation film embedded in the etched device isolation grooves in a subsequent step, so as to protect the portions for device activity regions of the semiconductor substrate covered by the protective film.

The above and further objects and features of the invention will more fully be apparent from the following detailed description with accompanying drawings.

DETAILED DESCRIPTION OF THE PREFERRED EMBODIMENTS

Figure 1A:
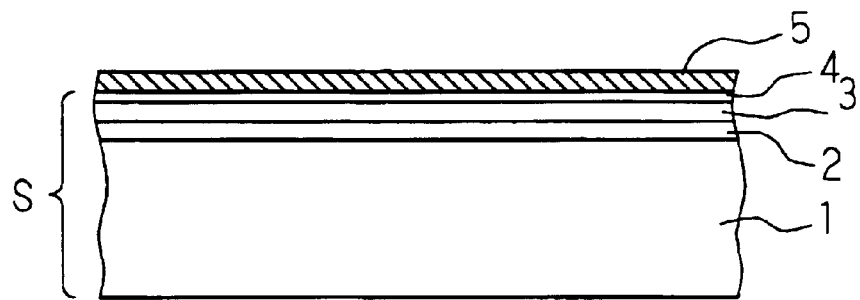
FIGS. 1A–1D and 2E–2G are schematic diagrams illustrating a method of semiconductor device fabrication according to the invention.

The present invention is described below with reference to the drawings illustrating the embodiments. An example of embodiment of fabricating a pair of CMOS transistors by the following processes is described below with reference to the schematic diagrams of FIGS. 1A–2G.

As a preprocess, a p-type (100) silicon substrate 1 is treated by high-temperature sulfuric acid cleaning and RCA cleaning. Then, the natural oxide film on the silicon substrate 1 is removed with 5% diluted hydrofluoric acid. Then, a silicon germanium layer 2 having a germanium concentration of 30% and a thickness of 150 nm is formed on the silicon substrate 1 by epitaxial growth at 500° C. using germanium hydride (GeH$_4$) and silicon hydride (SiH$_4$) in a low-pressure chemical vapor deposition (LP-CVD) system. After that, hydrogen ions are implanted into the semiconductor substrate composed of the silicon substrate 1 and the silicon germanium layer 2 under the conditions of implantation energy of 18 keV, dose of $3\times10^{16}$ H$^+$/cm$^2$, and implantation angle of 7°. Then, the semiconductor substrate is treated by high-temperature sulfuric acid cleaning and RCA cleaning. After the cleaning, the semiconductor substrate is annealed in nitrogen atmosphere at 800° C. for 10 min in an electric anneal furnace.

As a result, small cavities called micro cavities having a size of 10 nm or the like are formed in the vicinity of the peak of the distribution of the implanted hydrogen ions which is located at 20–50 nm in the direction from the interface between the silicon germanium layer 2 and the silicon substrate 1 to the silicon substrate 1. Stacking faults caused by the formation of the micro cavities slide so as to generate misfit dislocations in the interface between the silicon germanium layer 2 and the silicon substrate 1. This relaxes the strain in the crystal lattice of the silicon germanium layer 2.

A silicon germanium layer 3 serving as a semiconductor layer having a germanium concentration of 30% and a thickness of 300 nm is formed by epitaxial growth on the surface of the above-mentioned strain relaxed silicon germanium layer 2 where the strain has been relaxed. Then, a silicon layer 4 serving as a channel, through which carriers pass, having a thickness of 20 nm is formed on the silicon germanium layer 3 by epitaxial growth. At that time, the silicon germanium layer 3 has a larger lattice constant than the silicon layer 4. Accordingly, the silicon layer 4 suffers tension from the silicon germanium layer 3, so that strain appears in the silicon layer 4.

A protective film 5 having a thickness of 500–1500 nm for protecting portions for device activity regions in a subsequent process is deposited by CVD on the surface of the semiconductor substrate S formed as described above (FIG. 1A). The protective film 5 is composed of silicon nitride (Si$_3$N$_4$).

Figure 1B:
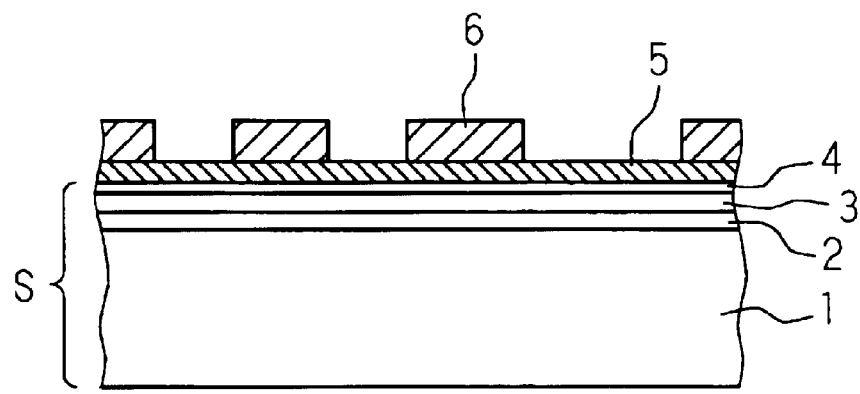

After that, photoresist 6 is spin-coated into a thickness of 500–1500 nm on the protective film 5. Then, the photoresist 6 is processed by optical exposure in an i-line stepper provided with a photomask for device isolation region (such as STI and LOCOS) formation used in ordinary LSI fabrication. The photoresist 6 is then developed with an alkaline developer. As a result, a photoresist pattern is formed by the photoresist 6 remaining on the protective film 5 surface in the portions for device activity regions (FIG. 1B).

Figure 1C:
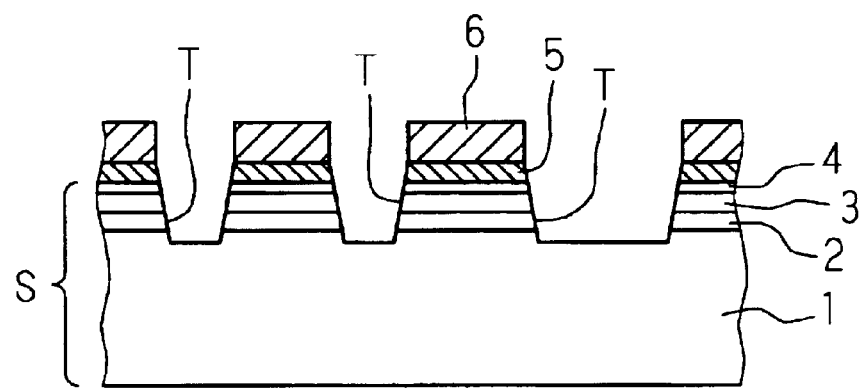

After that, the protective film 5 in the portions for device isolation regions is removed by reactive ion etching using the photoresist 6 remaining on the protective film 5 surface as a photomask. Then, trenches T are formed in the device isolation regions of the semiconductor substrate S by reactive ion etching using the remaining protective film 5 and photoresist 6 as a photomask (FIG. 1C). The formed trenches T have sharp edge portions E in the bottom (shown in the left-hand side part of FIG. 3).

Figure 1D:
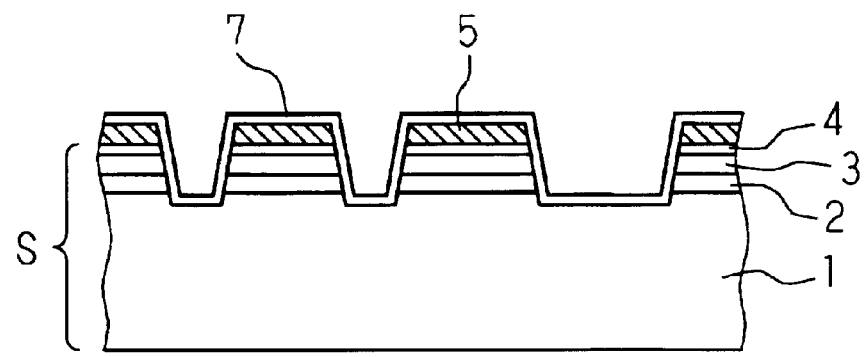

After that, the photoresist 6 remaining on the protective film 5 surface is removed. Then, a polycrystalline silicon film 7 having a thickness of 5–10 nm is deposited by CVD onto the entirety of the exposed surfaces, that is, the surface (top surface) and the exposed surfaces (side surfaces) of the protective film 5 as well as the side surfaces and the bottom surfaces of the trenches T (FIG. 1D).

Figure 2E:
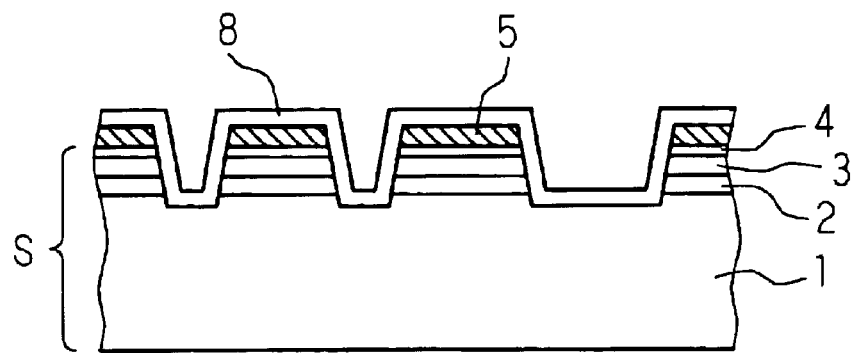

After that, the deposited polycrystalline silicon film 7 is dry-oxidized so as to form a silicon dioxide film 8 (FIG. 2E). For example, when the deposited polycrystalline silicon film 7 has a thickness of 5 nm, the polycrystalline silicon film is oxidized completely by dry oxidation at 950–1050° C. for 10–30 min.

Figure 3:
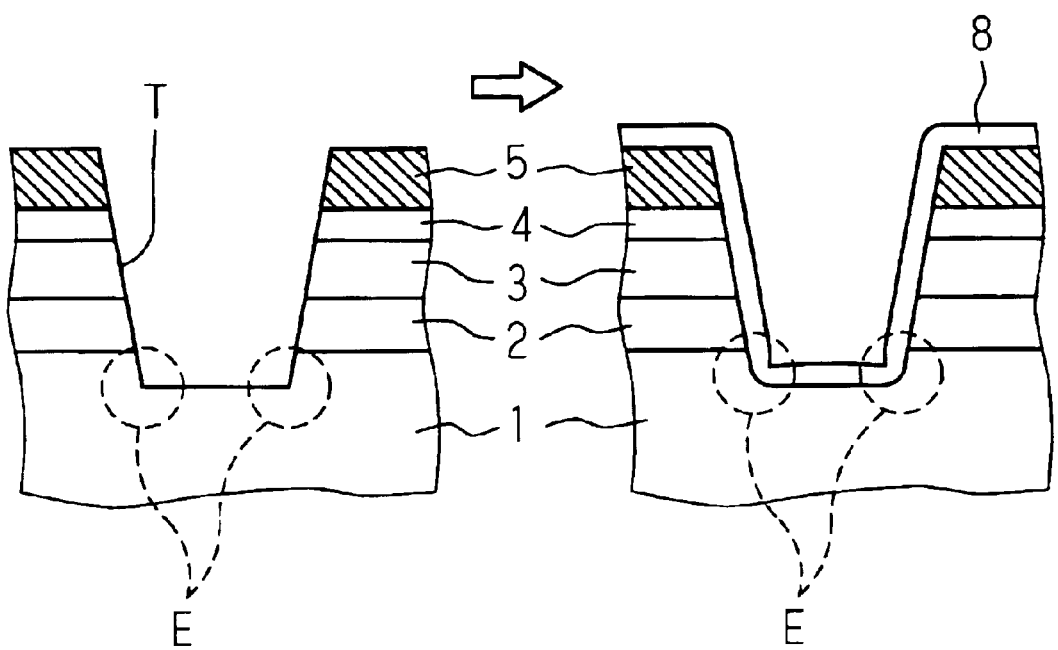
FIG. 3 is an enlarged view of the vicinity of a trench.
Figure 4A:
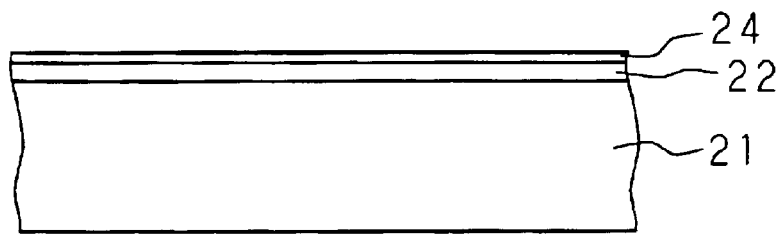
FIGS. 4A–4C and 5D–5E are schematic diagrams illustrating a prior art method of semiconductor device fabrication.
Figure 4B:
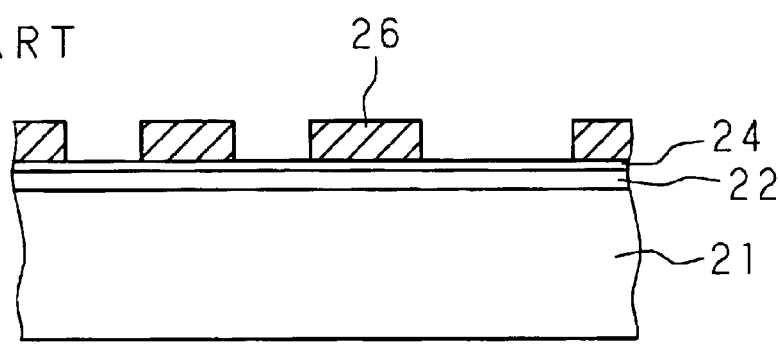
Figure 4C:
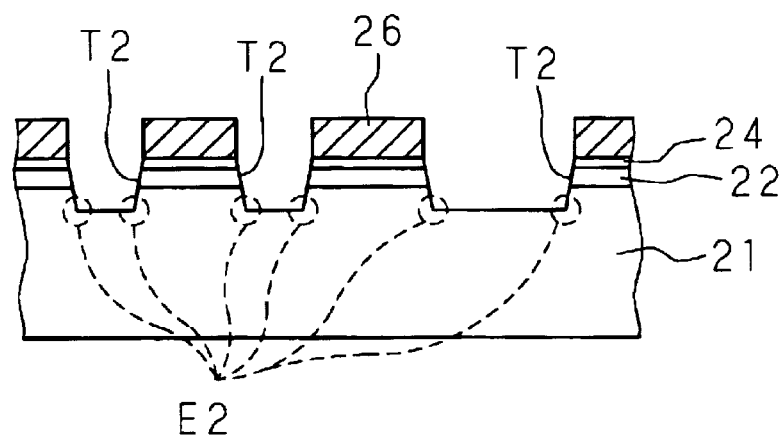
Figure 5D:
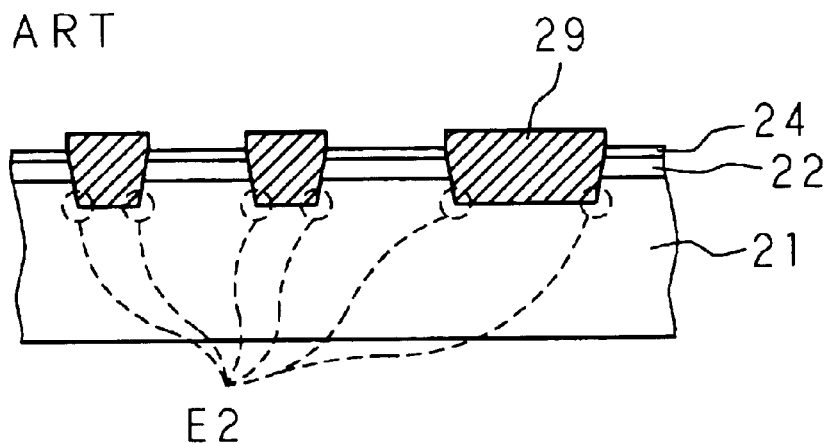
Figure 5E:
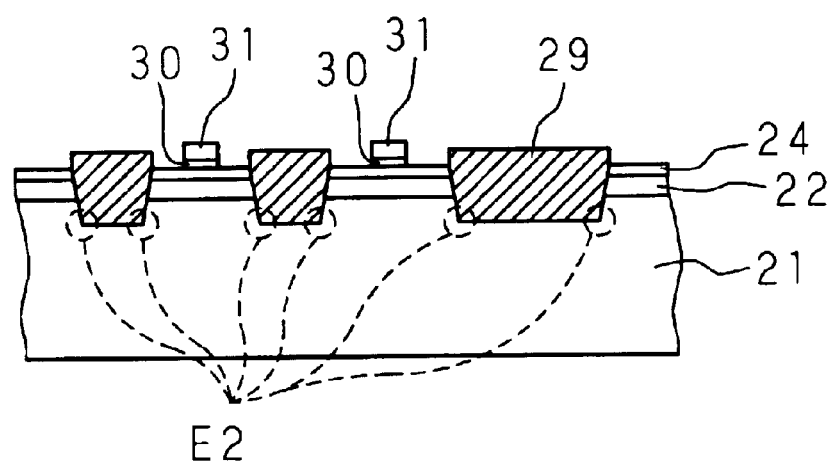

As a result, the sharp edge portions E in the trenches T which are shown in an enlarged view in the left-hand side part of FIG. 3 are rounded when the polycrystalline silicon film deposited on the side surfaces and the bottom surfaces of the trenches T is oxidized into silicon dioxide completely as shown in an enlarged view in the right-hand side part of the figure.

Figure 2F:
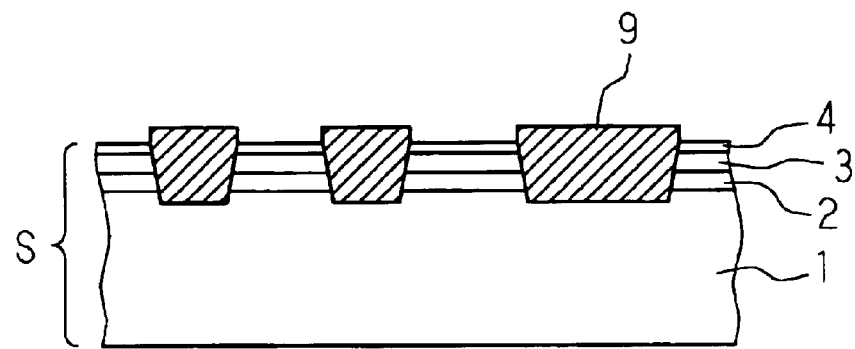

Then, a silicon dioxide film 9 serving as an insulation film is embedded in the trenches T by TEOS-CVD. After that, the silicon dioxide film 9 is polished and flattened by CMP using the protective film 5 as a stopper. After the flattening, the protective film 5 is removed (FIG. 2F).

Figure 2G:
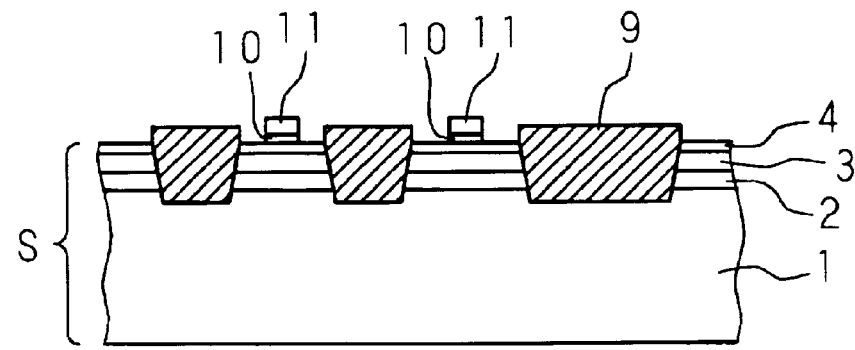

After that, impurities for well formation and for threshold voltage adjustment are introduced into the N-channel MOS transistor region and the P-channel MOS transistor region by ion implantation (not shown). Then, similarly to conventional methods of CMOS transistor fabrication, a gate oxide film 10 is formed, and then a polycrystalline silicon film is deposited by CVD. After that, gate electrodes 11 are formed by the dry etching of the deposited polycrystalline silicon film (FIG. 2G). Then, source-drain regions are formed. As a result, a pair of CMOS transistors is obtained according to the method of semiconductor device fabrication of the invention.

In the present embodiment, a semiconductor substrate S has been used that comprises a strain relaxed silicon germanium layer 2 in which the strain is relaxed and which is formed on a silicon substrate 1, wherein another silicon germanium layer 3 serving as a semiconductor layer is formed on the strain relaxed silicon germanium layer 2, and wherein a strained silicon layer 4 having strain is formed on the silicon germanium layer 3. However, the invention is not restricted to this and may be as follows. That is, the semiconductor substrate may be such that a strained silicon layer 4 is formed on the strain relaxed silicon germanium layer 2. Further, the semiconductor substrate may be such that another semiconductor layer is formed between the strain relaxed silicon germanium layer 2 and the silicon germanium layer 3 or alternatively between the silicon germanium layer 3 and the strained silicon layer 4. Furthermore, the silicon film deposited after the formation of the trenches T is not restricted to a polycrystalline silicon film, and may be another type of film composed solely of silicon, such as an amorphous silicon film and a single crystal silicon film.

In the present embodiment, a semiconductor substrate S has been used that is composed of a silicon substrate 1 on which a strain relaxed silicon germanium layer 2, a strained silicon layer 4, and the like are formed. However, the silicon substrate 1 may be replaced by a SOI substrate having a silicon layer on the surface thereof. Even in this case, CMOS transistors are fabricated that are similar to those obtained by using the silicon substrate 1.

According to the invention, a semiconductor substrate is used that comprises a lattice-strain relaxed silicon germanium layer formed on a silicon substrate or on a substrate having a silicon layer on the surface thereof, wherein a lattice strained silicon layer is formed said silicon germanium layer. Then, the portions for device isolation regions of said semiconductor substrate are etched so as to form device isolation grooves. After that, a silicon film is deposited on said semiconductor substrate. Then, the deposited silicon film is oxidized. By virtue of this method, an oxide film having a uniform thickness is formed on the surfaces of the silicon germanium layer and the silicon layer exposed as the side surfaces of trenches by the etching, while sharp edge portions in the trenches formed by the etching are rounded. As a result, device isolation regions are formed in which the occurrence of leak current is avoided and which have high electrical reliability.

According to the invention, a semiconductor substrate is used that comprises a lattice-strain relaxed silicon germanium layer formed on a silicon substrate or on a substrate having a silicon layer on the surface thereof, wherein a lattice strained silicon layer is formed on one or more semiconductor layers formed on said silicon germanium layer. Then, the portions for device isolation regions of said semiconductor substrate are etched so as to form device isolation grooves. After that, a silicon film is deposited on said semiconductor substrate. Then, the deposited silicon film is oxidized. By virtue of this method, an oxide film having a uniform thickness is formed on the surfaces of the silicon germanium layer, the semiconductor layers (on the silicon germanium layer), and the silicon layer exposed by the etching, while sharp edge portions in the trenches formed by the etching are rounded. As a result, device isolation regions are formed in which the occurrence of leak current is avoided and which have high electrical reliability.

According to the invention, the silicon film deposited on the semiconductor substrate in which device isolation grooves are formed has a thickness of at least 5 nm. This allows the sharp edge portions in the trenches to be rounded at a radius satisfying minimum requirement. Further, the deposited silicon film has a thickness of at most 10 nm. This avoids the formation of an unnecessarily thick oxide film, and hence maintains the detailed structure of the semiconductor device.

According to the invention, the silicon film deposited on the semiconductor substrate in which device isolation grooves are formed is oxidized completely. By virtue of this, a uniform oxide film is formed on the surfaces of the silicon germanium layer and the silicon layer (or on the surfaces of the silicon germanium layer, the semiconductor layers (on the silicon germanium layer), and the silicon layer) exposed as the side surfaces of trenches. This avoids possible defects that could occur owing to the remained interface between an unoxidized silicon film and the side surface of the trench in case that the surface of the deposited silicon film were oxidized partly.

According to the invention, before said etching step, a protective film composed of silicon nitride or the like is deposited on the surface of the semiconductor substrate, so as to protect, from the etching, the portions for device activity regions of the semiconductor substrate covered by the protective film. Further, the protective film serves as a stopper in the step of polishing the device isolation film embedded in the etched device isolation grooves in a subsequent step, so as to protect the portions for device activity regions of the semiconductor substrate covered by the protective film.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A method of semiconductor device fabrication using a semiconductor substrate comprising a lattice-strain relaxed silicon germanium layer and a lattice strained silicon layer formed in this order on a silicon substrate or on a substrate having a silicon layer on the surface thereof, said method comprising:

an etching step comprising etching portions for device isolation regions of said semiconductor substrate so as to form device isolation grooves;

a deposition step comprising depositing a silicon film on said semiconductor substrate, including in the device isolation grooves formed in said etching step so that the silicon film contacts sidewalls of at least the lattice-strain relaxed silicon germanium layer and sidewalls of the lattice strained silicon layer at least along side(s) of the grooves;

an oxidation step of oxidizing the deposited silicon film; and forming transistors in respective areas between the grooves in and/or over the lattice strained silicon layer.

2. A method of semiconductor device fabrication according to claim 1, wherein in said deposition step, a silicon film of 5 through 10 nm is deposited.

3. A method of semiconductor device fabrication according to claim 1, wherein in said oxidation step, said deposited silicon film is oxidized completely.

4. A method of semiconductor device fabrication according to claim 1, further comprising the step of depositing a protective film for protecting portions for device activity regions onto the surface of said semiconductor substrate before said etching step.

5. A method of semiconductor device fabrication according to claim 2, wherein in said oxidation step, said deposited silicon film is oxidized completely.

6. A method of semiconductor device fabrication according to claim 5, further comprising the step of depositing a protective film for protecting portions for device activity regions onto the surface of said semiconductor substrate before said etching step.

7. A method of semiconductor device fabrication according to claim 3, wherein in said deposition step, a silicon film of 5 through 10 nm is deposited.

8. A method of semiconductor device fabrication according to claim 7, further comprising the step of depositing a protective film for protecting portions for device activity regions onto the surface of said semiconductor substrate before said etching step.

9. A method of semiconductor device fabrication according to claim 4, wherein in said deposition step, a silicon film of 5 through 10 nm is deposited.

10. A method of semiconductor device fabrication using a semiconductor substrate comprising a lattice-strain relaxed silicon germanium layer, one or more semiconductor layers, and a lattice strained silicon layer formed in this order on a silicon substrate or on a substrate having a silicon layer on the surface thereof, said method comprising:

an etching step comprising etching portions for device isolation regions of said semiconductor substrate so as to form device isolation grooves;

a deposition step comprising depositing a silicon film on said semiconductor substrate, including in the device isolation grooves formed in said etching step so that the silicon film contacts sidewalls of at least the lattice-strain relaxed silicon germanium layer and sidewalls of the lattice strained silicon layer alone side(s) of the grooves; and an oxidation step of oxidizing the deposited silicon film.

11. A method of semiconductor device fabrication according to claim 10, wherein in said deposition step, a silicon film of 5 through 10 nm is deposited.

12. A method of semiconductor device fabrication according to claim 10, wherein in said oxidation step, said deposited silicon film is oxidized completely.

13. A method of semiconductor device fabrication according to claim 10, further comprising the step of depositing a protective film for protecting portions for device activity regions onto the surface of said semiconductor substrate before said etching step.

14. A method of semiconductor device fabrication according to claim 11, wherein in said oxidation step, said deposited silicon film is oxidized completely.

15. A method of semiconductor device fabrication according to claim 14, further comprising the step of depositing a protective film for protecting portions for device activity regions onto the surface of said semiconductor substrate before said etching step.

16. A method of semiconductor device fabrication according to claim 12, wherein in said deposition step, a silicon film of 5 through 10 nm is deposited.

17. A method of semiconductor device fabrication according to claim 16, further comprising the step of depositing a protective film for protecting portions for device activity regions onto the surface of said semiconductor substrate before said etching step.

18. A method of semiconductor device fabrication according to claim 13, wherein in said deposition step, a silicon film of 5 through 10 nm is deposited.

19. A method of semiconductor device fabrication according to claim 18, wherein in said oxidation step, said deposited silicon film is oxidized completely.

* * * * *